US012134161B2

(12) United States Patent
Kim et al.

(10) Patent No.: US 12,134,161 B2
(45) Date of Patent: Nov. 5, 2024

(54) METHOD FOR POLISHING DIAMOND CRYSTAL, AND DIAMOND CRYSTAL

(71) Applicant: Orbray Co., Ltd., Tokyo (JP)

(72) Inventors: Seongwoo Kim, Tokyo (JP); Daiki Fujii, Tokyo (JP); Koki Oyama, Tokyo (JP); Koji Koyama, Tokyo (JP)

(73) Assignee: Orbray Co., Ltd., Tokyo (JP)

( * ) Notice: Subject to any disclaimer, the term of this patent is extended or adjusted under 35 U.S.C. 154(b) by 1001 days.

(21) Appl. No.: 17/017,220

(22) Filed: Sep. 10, 2020

(65) Prior Publication Data

US 2020/0406420 A1 Dec. 31, 2020

Related U.S. Application Data

(63) Continuation of application No. PCT/JP2019/010524, filed on Mar. 14, 2019.

(30) Foreign Application Priority Data

Mar. 16, 2018 (JP) ................................ 2018-048664

(51) Int. Cl.
*B24B 37/04* (2012.01)
(52) U.S. Cl.
CPC .................. *B24B 37/042* (2013.01)
(58) Field of Classification Search
None
See application file for complete search history.

(56) References Cited

U.S. PATENT DOCUMENTS 1,213,164 A * 1/1917 Name not available ..................... B24B 9/16
451/41
1,727,425 A * 9/1929 Boman ..................... B24B 9/16
51/307

(Continued)

FOREIGN PATENT DOCUMENTS

CN 107457616 A * 12/2017 ............... B24B 1/00
JP H05148088 A 6/1993

(Continued)

OTHER PUBLICATIONS

An Office Action mailed by the China National Intellectual Property Administration on Dec. 3, 2020, which corresponds to Chinese Patent Application No. 201980002973.X and is related to U.S. Appl. No. 17/017,220.

(Continued)

*Primary Examiner* — Bryan R Muller
*Assistant Examiner* — Dana Lee Poon
(74) *Attorney, Agent, or Firm* — Studebaker & Brackett PC

(57) ABSTRACT

A method for polishing a diamond crystal includes preparing a diamond crystal having a main surface having a plane orientation of (100). Mechanical polishing is performed on the main surface using a polishing wheel such that: a tangent contacts a curve extending in a rotation direction of the wheel and contacting a contact position between the diamond crystal and the wheel that is rotating; and a tangent direction of the tangent at the contact position is within a range of ±10 degrees relative to a <110> direction of the diamond crystal, thereby causing an affected region to appear such that the affected region is parallel to a direction of a plane orientation (111) of the diamond crystal and penetrates the diamond crystal onto the main surface. Chemical mechanical polishing is performed on the main (Continued)

surface to remove the affected region, thereby removing the affected region from the main surface.

2 Claims, 10 Drawing Sheets

(56) References Cited

U.S. PATENT DOCUMENTS

| | | | | |
|---|---|---|---|---|
| 3,568,368 | A * | 3/1971 | Name not available | B24B 9/168 451/221 |
| 5,179,931 | A * | 1/1993 | Leibowitz | B24B 9/162 451/41 |
| 9,259,819 | B2 * | 2/2016 | Singh | C09G 1/02 |
| 2023/0339064 | A1 * | 10/2023 | Lu | B24B 37/07 |

FOREIGN PATENT DOCUMENTS

| | | |
|---|---|---|
| JP | 2015179830 A | 10/2015 |
| WO | 2015046294 A1 | 4/2015 |

OTHER PUBLICATIONS

International Search Report issued in PCT/JP2019/010524; mailed May 7, 2019.

The extended European search report issued by the European Patent Office on Nov. 26, 2021, which corresponds to European Patent Application No. 19768491.3-1012 and is related to U.S. Appl. No. 17/017,220.

* cited by examiner

METHOD FOR POLISHING DIAMOND CRYSTAL, AND DIAMOND CRYSTAL

CROSS-REFERENCE TO RELATED APPLICATIONS

The present application is a continuation application of International Application No. PCT/JP2019/010524, filed Mar. 14, 2019, which claims priority to Japanese Patent Application No. 2018-048664, filed Mar. 16, 2018. The contents of these applications are incorporated herein by reference in their entirety.

BACKGROUND OF THE INVENTION

Field of the Invention

The present invention relates to a method for polishing a diamond crystal and to a diamond crystal.

Discussion of the Background

Diamond crystals are expected to be ultimate materials for semiconductors. This is because diamond crystals have numerous properties unequaled by other semiconductor materials, examples of such properties including high thermal conductivity, high electron mobility, high hole mobility, high dielectric breakdown field strength, low dielectric loss, and band gap wideness. Diamond crystals have a band gap of approximately 5.5 eV, which is a significantly high value as compared with other existing semiconductor materials. Particular diamond crystals to note, among those that have been developed in recent years, include: ultraviolet emitting elements utilizing the above-described wide band gap; field effect transistors having superior high-frequency properties; and heat sinks.

WO/2015/046294 discloses an example diamond crystal.

SUMMARY OF THE INVENTION

According to one aspect of the present invention, a method for polishing a diamond crystal includes preparing a diamond crystal having a main surface having a plane orientation of (100). Mechanical polishing is performed on the main surface of the diamond crystal using a polishing wheel such that: a tangent contacts a curve that extends in a rotation direction in which the polishing wheel is rotating and that contacts a contact position at which the diamond crystal contacts the polishing wheel that is rotating; and a tangent direction of the tangent at the contact position is within a range of ±10 degrees relative to a <110> direction of the diamond crystal, thereby causing an affected region to appear such that the affected region is parallel to a direction of a plane orientation (111) of the diamond crystal and penetrates the diamond crystal onto the main surface. Chemical mechanical polishing is performed on the main surface of the diamond crystal to remove the affected region, thereby removing the affected region from the main surface.

According to another aspect of the present invention, a diamond crystal has a main surface having a plane orientation of (100). No affected region is contained in the diamond crystal in parallel to a direction of an orientation (111) of the diamond crystal, and no affected region appears on the main surface of the diamond crystal.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein.

DESCRIPTION OF THE EMBODIMENTS

Figure 1:
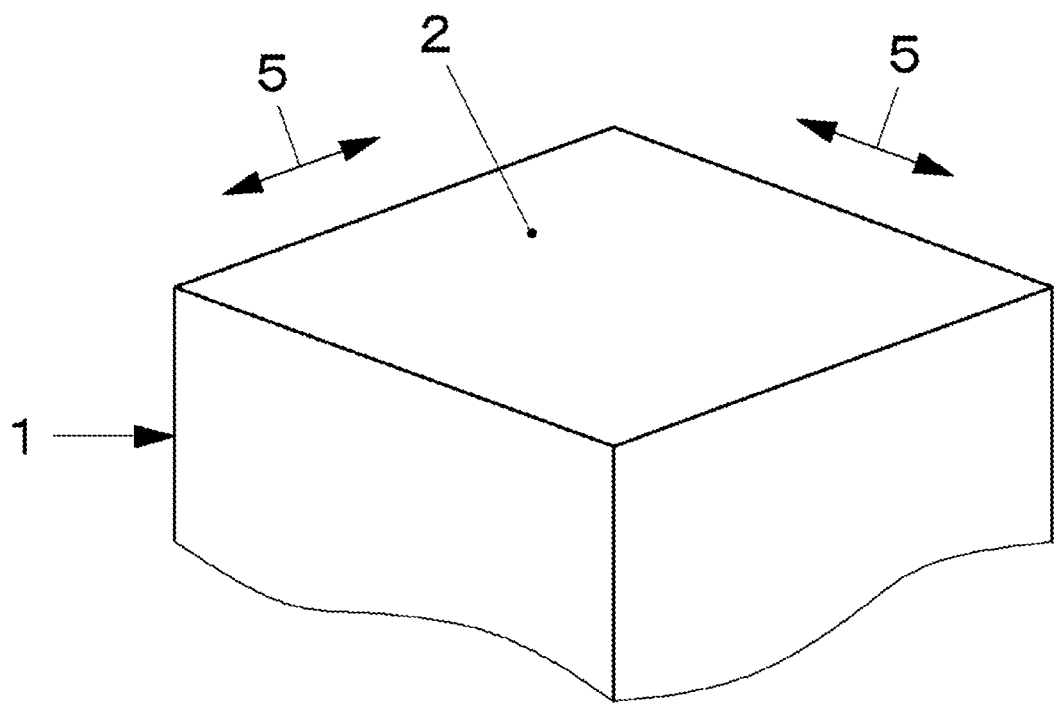
FIG. 1 illustrates a diamond crystal to which a polishing method according to this embodiment is applied.

The embodiments will now be described with reference to the accompanying drawings, wherein like reference numerals designate corresponding or identical elements throughout the various drawings.

When a diamond crystal is used in a semiconductor application, a possible form is that a semiconductor layer is formed on a main surface of the diamond crystal. In this case, in order to make the surface roughness of the main surface satisfy values required in the market, it is necessary to polish the main surface.

Figure 10:
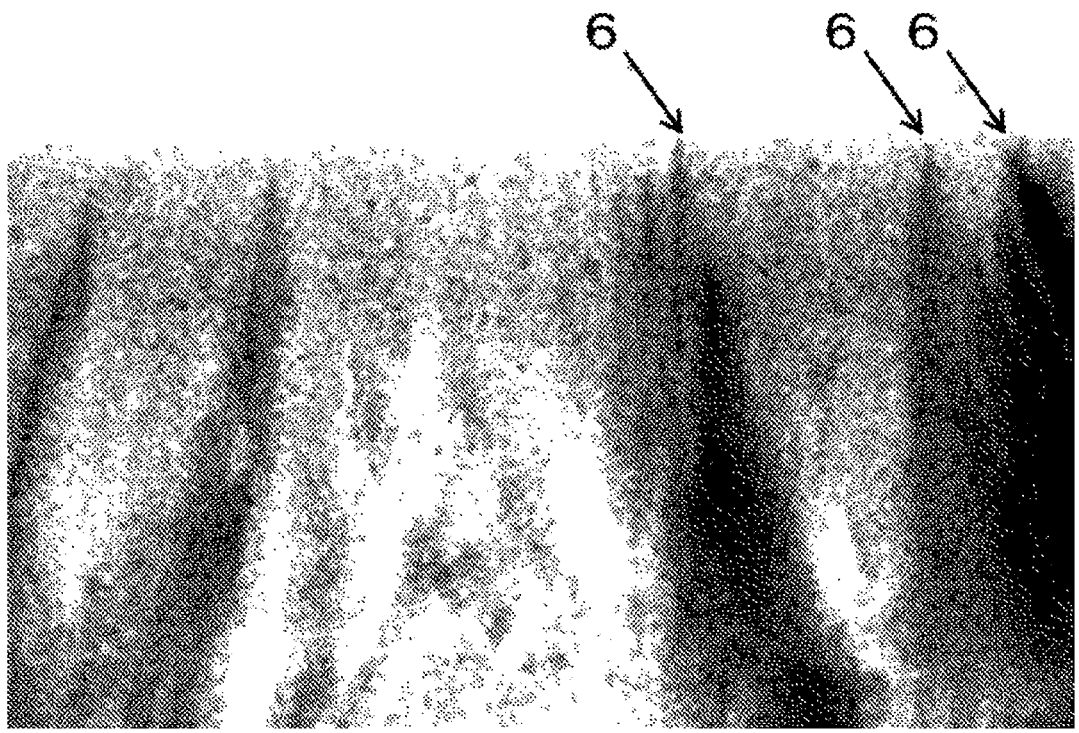
FIG. 10 is a topography picture of a side surface of the diamond crystal such that the picture is taken when the diamond crystal is observed by synchrotron x-ray topography after being subjected to mechanical polishing.

Under the circumstances, the Applicant grew and formed a diamond crystal on a surface of a ground substrate by hetero-epitaxial growth, and performed mechanical polishing on a main surface (plane orientation (100)) of the diamond crystal that has been grown. Then, the Applicant observed the main surface by synchrotron x-ray topography. FIG. 10 shows a topography picture of a side surface of the diamond crystal obtained in the synchrotron x-ray topography.

As shown in FIG. 10, affected regions 6 were observed in the main surface of the diamond crystal, which has been subjected to mechanical polishing, and in thickness regions near the main surface. The affected regions 6 include dislocations and penetrate the main surface of the diamond crystal.

When a diamond crystal is used in a semiconductor application, the formation of affected regions that include dislocations and penetrate the main surface is not preferable in that when a semiconductor layer is formed on the main surface of the diamond crystal, the affected regions may be taken over to the semiconductor layer, forming dislocations and/or defects in the semiconductor layer. There is a demand, therefore, that a diamond crystal is without affected regions including dislocations on the main surface of the diamond crystal at the time when the diamond crystal is shipped to the market shipped to markets.

Under the circumstances, the Applicant introduced chemical mechanical polishing (hereinafter referred to as CMP) to a diamond crystal and observed main surface conditions. As a result, the Applicant found that performing CMP alone can not remove all of the affected regions appearing on or in the main surface.

A first feature of this embodiment is a method for polishing a diamond crystal. The method includes preparing a diamond crystal having a main surface having a plane orientation of (100). The method also includes performing mechanical polishing on the main surface of the diamond crystal using a polishing wheel such that: a tangent contacts a curve that extends in a rotation direction in which the polishing wheel is rotating and that contacts a contact position at which the diamond crystal contacts the polishing wheel that is rotating; and a tangent direction of the tangent at the contact position is within a range of ±10° (degrees) relative to a <110> direction of the diamond crystal, thereby causing an affected region to appear such that the affected region is parallel to a direction of a plane orientation (111) of the diamond crystal and penetrates the diamond crystal onto the main surface. The method also includes performing chemical mechanical polishing on the main surface of the diamond crystal to remove the affected region, thereby removing the affected region from the main surface.

A second feature of this embodiment is a diamond crystal having a main surface having a plane orientation of (100). No affected region parallel to a direction of an orientation (111) of the diamond crystal is contained in the diamond crystal and appears on the main surface of the diamond crystal.

The above method and the above configuration of the diamond crystal cause, purposefully by mechanical polishing, an affected region to appear such that the affected region is parallel to a direction of a plane orientation (111) of the diamond crystal and penetrates the diamond crystal onto the main surface. By causing an affected region to temporarily appear collectively in parallel to the direction of the plane orientation (111) of the diamond crystal, the affected region appearing in the diamond crystal is removed completely by the CMP, which is performed after the mechanical polishing. In this manner, a method for polishing a diamond crystal is realized such that the method eliminates affected regions including dislocations from the main surface of the diamond crystal; and a diamond crystal is realized with the affected regions removed from the main surface. It is to be noted that the limitation "within a range of ±10°" encompasses ±0°, −10°, and +10°.

A third feature of this embodiment is a method for polishing a diamond crystal. The method includes performing CMP to make the surface roughness Rq of the main surface equal to or less than 5 nm. A fourth feature is a diamond crystal having a main surface that has a surface roughness Rq of equal to or less than 5 nm.

The above method and the above configuration of the diamond crystal provide a diamond crystal whose main surface is kept at or below 5-nm surface roughness Rq. This makes the diamond crystal usable as a growth foundation crystal for semiconductor layers.

By referring to FIGS. 1 to 7, a method according to an embodiment of the present invention for polishing a diamond crystal, and a diamond crystal according to an embodiment of the present invention will be described below. First, a diamond crystal 1 is prepared as illustrated in FIG. 1. The diamond crystal 1 has a bulk body, and has a main surface 2. The main surface 2 has a plane orientation of (100) and has <110> directions as indicated by arrows 5 in FIG. 1. The diamond crystal 1 may be a monocrystal or a polycrystal. In FIG. 1, the diamond crystal 1 is described as a diamond crystal having a quadrangular main surface 2, as an example exterior of the diamond crystal 1. The exterior of the diamond crystal 1, however, will not be limited to a quadrangular shape but may have any other shape.

The diamond crystal 1 preferably has a thickness large enough to provide a strength that eliminates or minimizes handling inconveniences. Specifically, the diamond crystal 1 preferably has a thickness of equal to or less than 0.3 mm. Also, diamond crystals are significantly hard materials, and for considerations such as cleavability of resulting elements or devices, the upper limit of the thickness of the diamond crystal 1 is preferably equal to or less than 3.0 mm.

Also, the method of growing the diamond crystal 1 may be any method that is based on hetero-epitaxial growth or homo-epitaxial growth using, for example, chemical vapor deposition (CVD). From among diamond crystals that have been thus grown and formed, a diamond crystal having a main surface having a plane orientation of (100) may be prepared.

Figure 2:
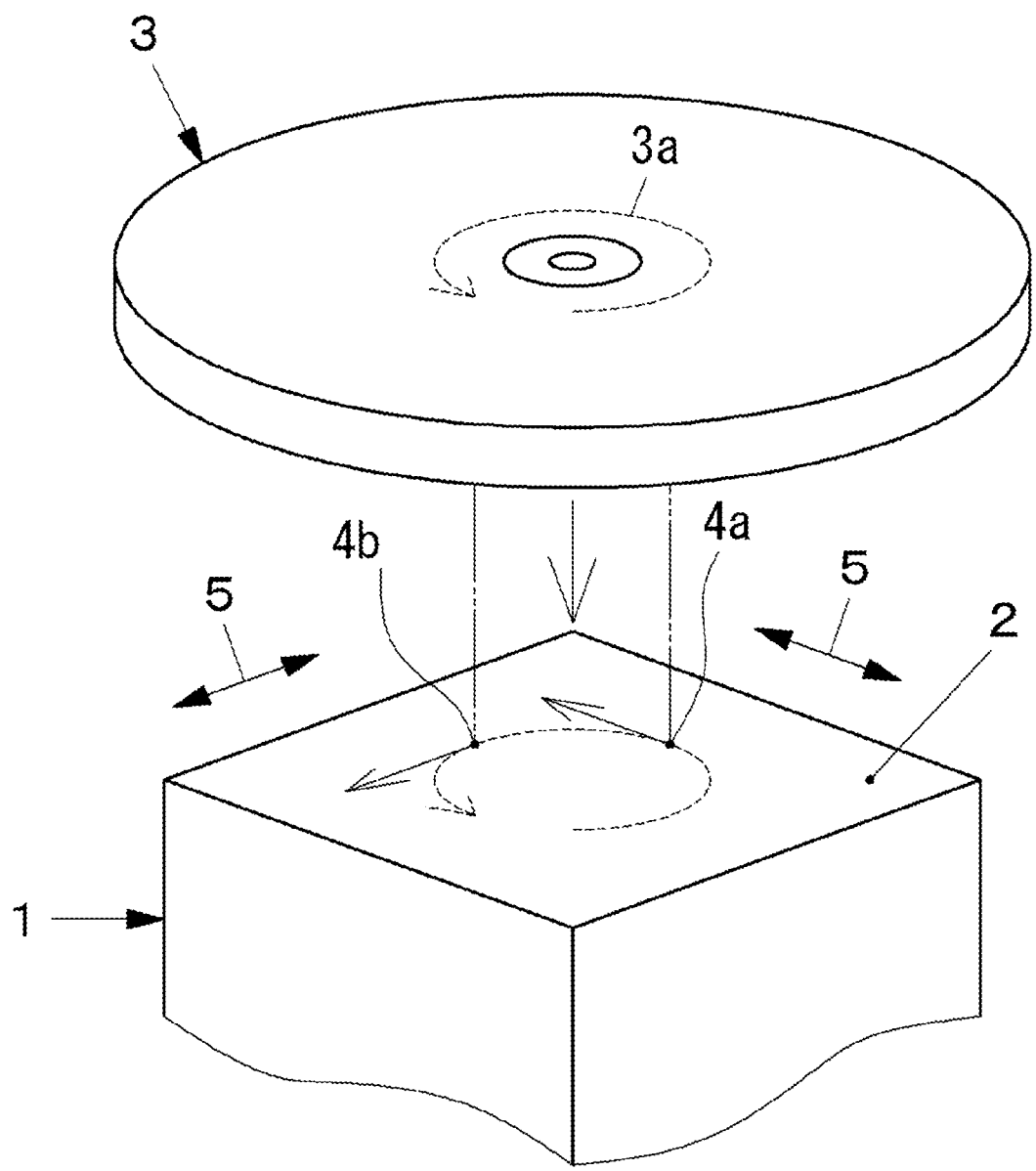
FIG. 2 schematically illustrates: a rotation direction of a polishing wheel used in the polishing method according to this embodiment; tangent directions of tangents on contact positions at which the diamond crystal illustrated in FIG. 1 contacts the polishing wheel; and <110> directions of the diamond crystal.

Next, as illustrated in FIG. 2, mechanical polishing is performed on the main surface 2 of the diamond crystal 1 using a polishing wheel (polishing wheel) 3. The polishing wheel 3 and polishing agents may be commercially available products.

Figure 3:
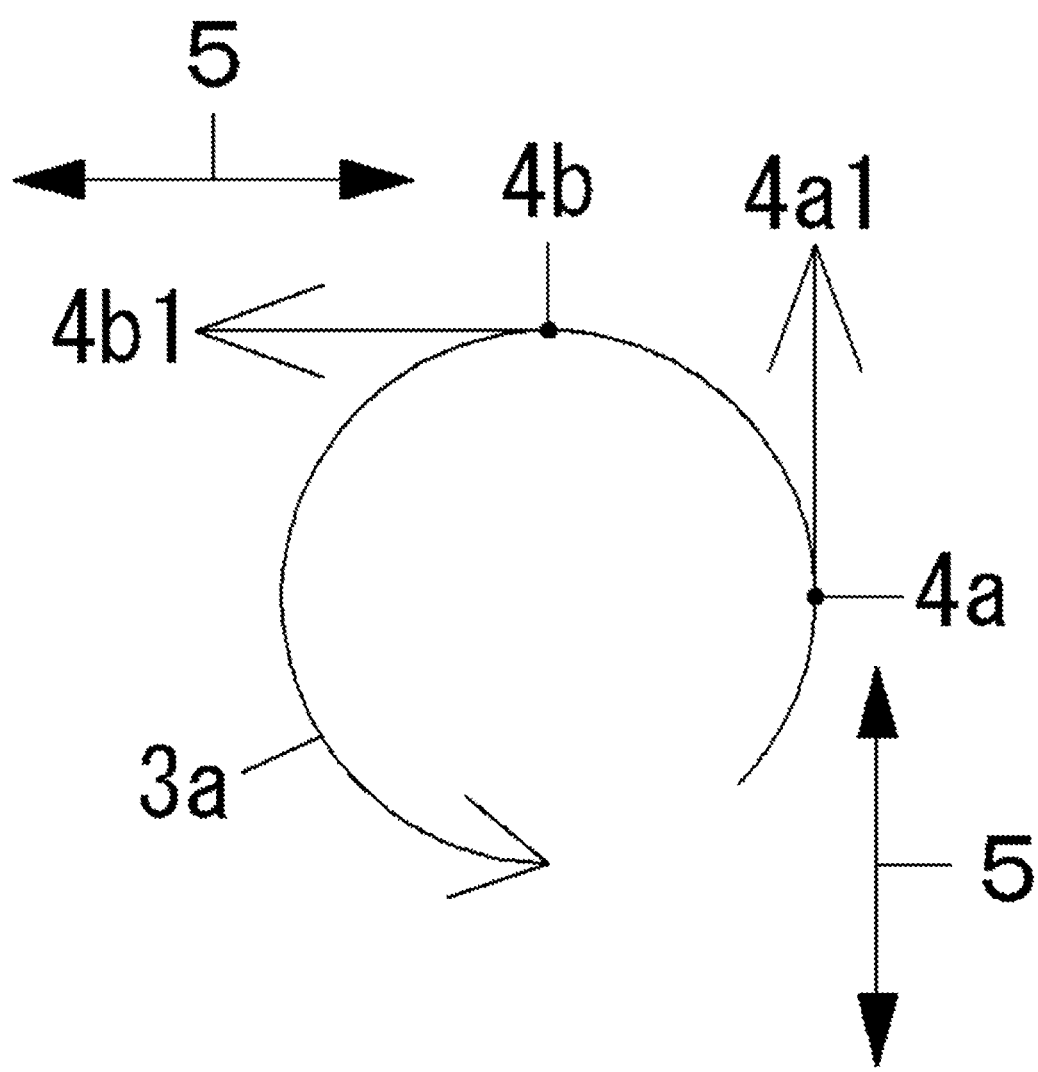
FIG. 3 is a plan view of, as seen from the polishing wheel side, the rotation direction of the polishing wheel illustrated in FIG. 2, the contact position of the diamond crystal and the polishing wheel, the tangent directions, and the <110> directions of the diamond crystal.

When mechanical polishing is performed on the main surface 2 of the diamond crystal 1 using the polishing wheel 3, the diamond crystal 1 contacts the polishing wheel 3 that is rotating at contact positions. Two representative contact positions (4a and 4b) are illustrated in FIG. 2. The rotation direction in which the polishing wheel 3 rotates is indicated by arrow 3a in FIGS. 2 and 3. In this embodiment, a tangent extends in a tangent direction 4a1 and contacts a curve extending in the rotation direction 3a at the contact position 4a. Also, a tangent extends in a tangent direction 4b1 and contacts the curve at the contact position 4b. The tangent directions 4a1 and 4b1 are set within a range of ±10° relative to a <110> direction of the diamond crystal 1 (the directions indicated by the arrows 5 in FIGS. 1 to 3). It is to be noted that the limitation "within a range of ±10°" encompasses ±0°. In FIGS. 2 and 3, the angles, θ, that the tangent directions 4a1 and 4b1 form with the respective <110> directions 5 of the diamond crystal 1 are ±0° (that is, the tangent directions 4a1 and 4b1 are parallel to the respective <110> directions 5). For this reason, illustration of the leading symbol θ is omitted in FIG. 3.

Figure 6:
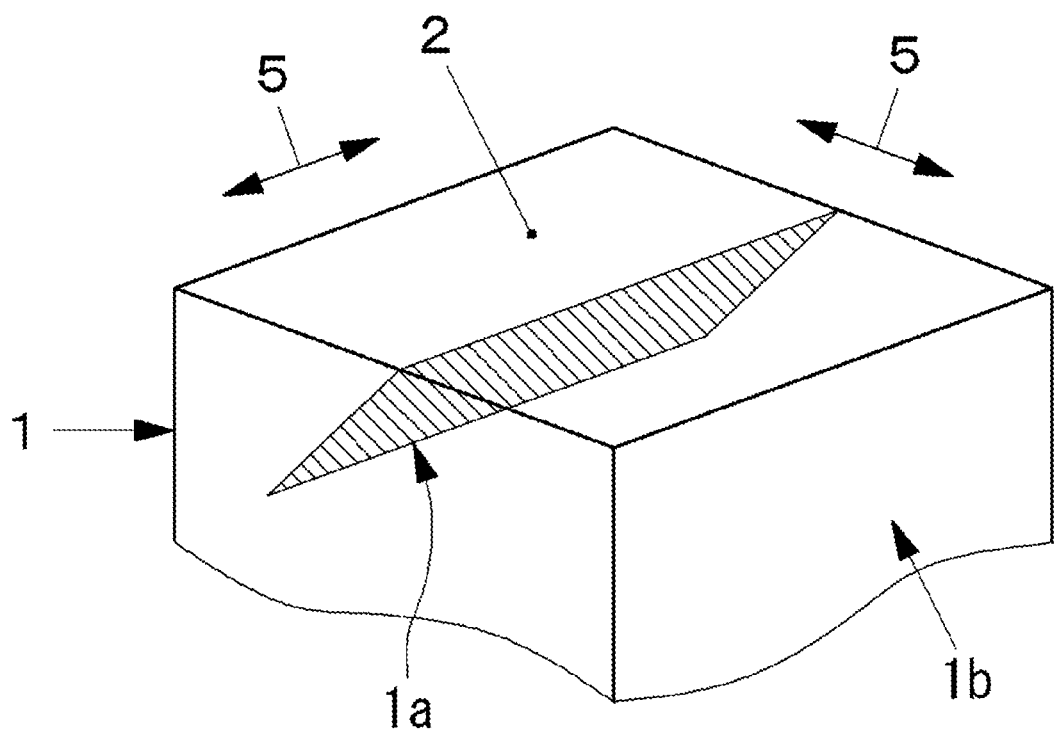
FIG. 6 illustrates an affected region caused to appear after mechanical polishing performed in the polishing method according to this embodiment such that the affected region is parallel to a (111) direction of the diamond crystal and penetrates a main surface of the diamond crystal.

Thus, mechanical polishing is performed on the main surface 2 of the diamond crystal 1 with the tangent directions 4a1 and 4b1 set within a range of ±10° relative to the respective <110> directions 5. The Applicant has verified that by performing such mechanical polishing, an affected region 1*a* is caused to appear as illustrated in FIG. 6; specifically, the affected region 1*a* appears collectively in a direction parallel to the direction of the plane orientation (111) of the diamond crystal 1, and penetrates the diamond crystal 1 onto the main surface 2. In FIG. 6, the affected region 1*a* is described as appearing at a single position, with clarity considered as highest in priority. The Applicant has verified, however, that a plurality of affected regions 1*a* appeared collectively in a direction(s) parallel to the direction of orientation (111) and penetrate the diamond crystal 1 onto the main surface 2.

This will be described in more detail. The polishing wheel 3 is moved relative to the main surface 2 while kept in contact the main surface 2 at such contact positions that the angles θ, which the tangent directions 4*a*1 and 4*b*1 form with the respective <110> directions 5, are within a range of ±10°. Specifically, the polishing wheel 3 is moved while kept in contact with the entire area of the main surface 2 such that the angle θ falls within a range of ±10° at least once at each of the contact positions with the polishing wheel 3 included in the entire area of the main surface 2.

Conventional practice is that when an affected region 1*a* penetrates a diamond crystal 1 and appears on its main surface 2 after the main surface 2 has been subjected to mechanical polishing, the diamond crystal 1 is determined as a defective product. In this embodiment, however, it has been found that all the affected regions, including the affected region 1*a*, can be removed completely by CMP, described later. In light of this finding, the affected region 1*a* is purposefully caused to appear at the mechanical polishing stage.

The principle behind how the affected region 1*a* appears in a direction parallel to the direction of the orientation (111) is known. The Applicant, however, established a theory that explains that the (111) direction and the direction parallel to the (111) direction may be considered as directions in which affected regions tend to appear comparatively easily when machining or processing is performed. The affected region 1*a* is considered as having appeared collectively in a direction parallel to the (111) direction by making (100) the plane orientation of the main surface 2 and by moving the polishing wheel 3 relative to the main surface 2 while making the polishing wheel 3 contact the main surface 2 such that the angle θ is within a range of ±10°, as described above. It is to be noted that since the affected region 1*a* has been caused to appear by mechanical polishing, the affected region 1*a* is considered as including dislocations.

As a result of studies and experiments conducted by the Applicant, the Applicant has reached a conclusion regarding conditions for causing an affected region 1*a* to appear such that the affected region 1*a* is parallel to the direction of the plane orientation (111) of the diamond crystal 1 and penetrates the diamond crystal 1 onto the main surface 2. The conditions include: that the main surface 2 has a plane orientation of (100); and that the tangent directions 4*a*1 and 4*b*1 are kept within a range of ±10° relative to the respective <110> directions 5 of the diamond crystal 1.

Figure 4:
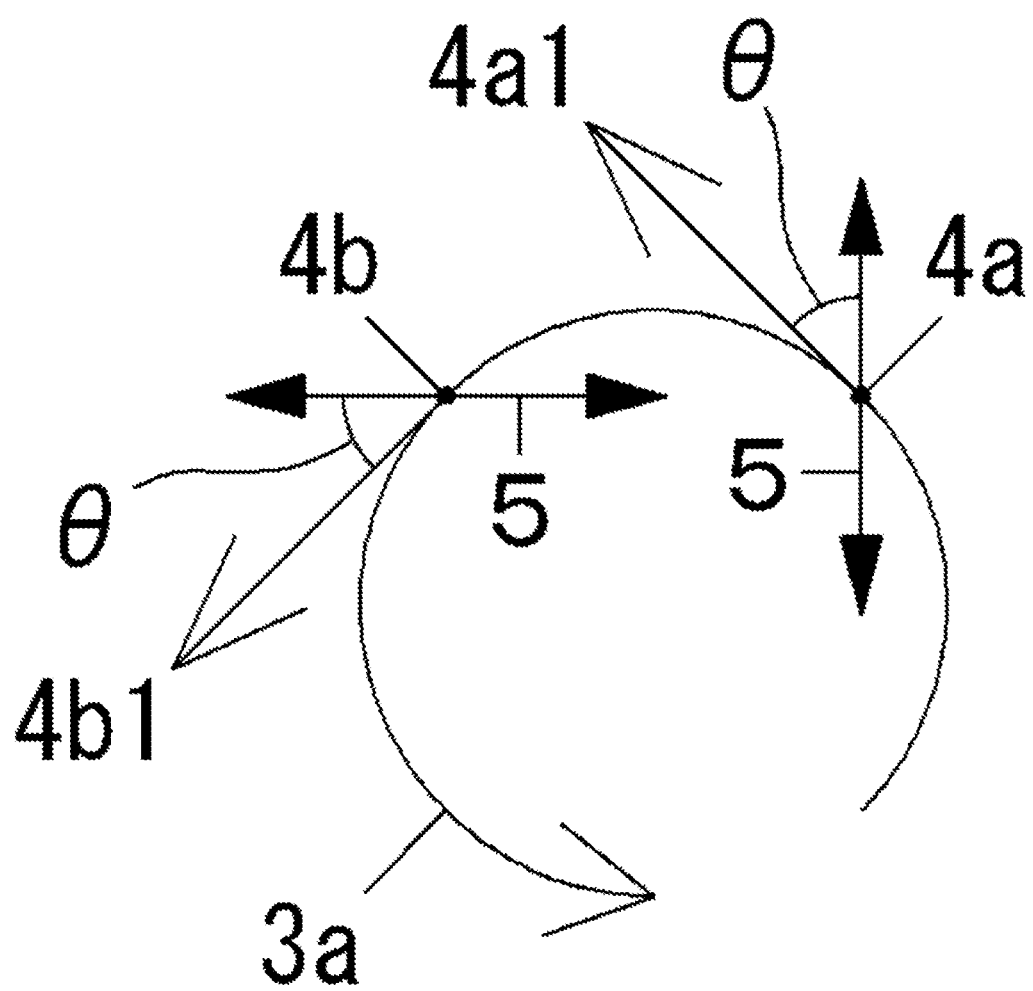
FIG. 4 is a modification of the plan view illustrated in FIG. 3.
Figure 5:
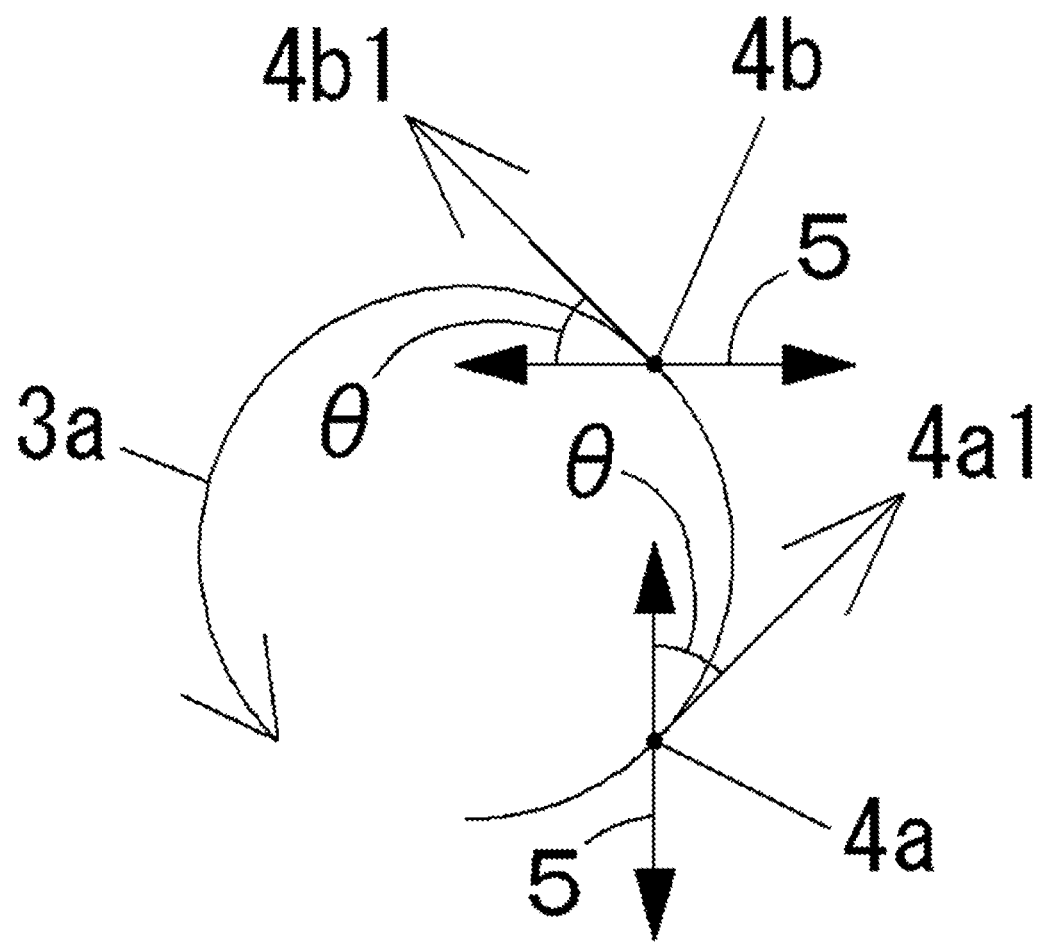
FIG. 5 is another modification of the plan view illustrated in FIG. 3.

It is to be noted that FIGS. 4 and 5 illustrate example contact positions at which the angle θ keeps out of the ±10° range, never falling within a range of ±10°, even once. At these contact positions, the affected regions including dislocations were not located collectively in a direction parallel to the direction of the orientation (111), and the surface roughness was not on a flat level on the atomic level. As a result, these affected regions were not removed quickly by CMP, described later. Further, new affected regions possibly attributed to the CMP were found to have formed. As a result, it was confirmed that the affected regions on the main surface 2 are not completely removed. It is to be noted that FIGS. 4 and 5 illustrate example contact positions at which the angle θ relative to the <110> direction 5 is ±45°.

Figure 7:
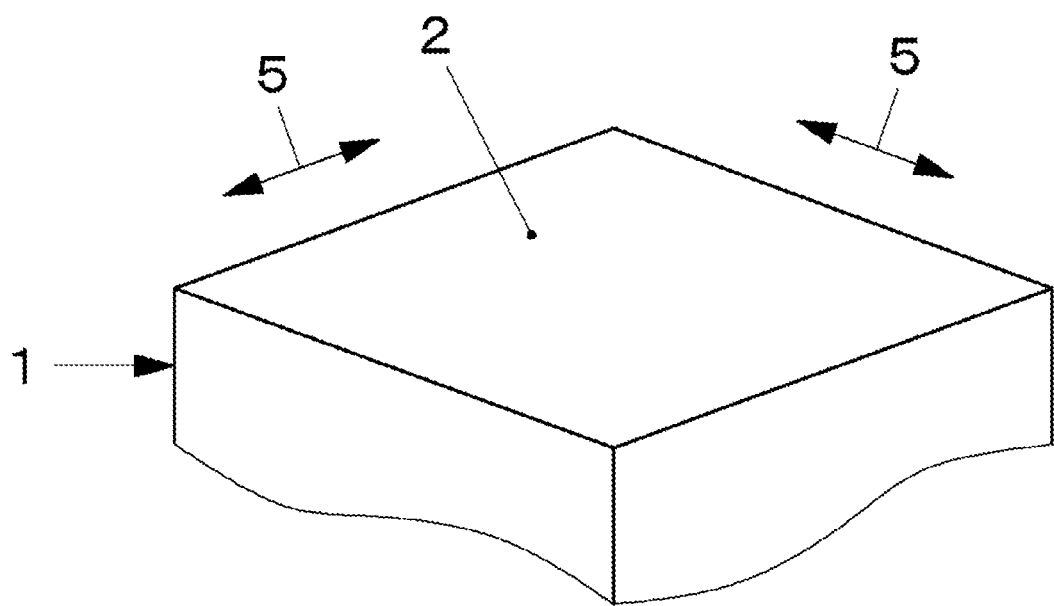
FIG. 7 schematically illustrates the diamond crystal with the affected region in FIG. 6 removed by CMP.

Next, CMP was performed on the main surface 2 of the diamond crystal 1 obtained by the mechanical polishing, thereby removing the affected region 1*a*. The CMP is performed until the time when the affected region 1*a* is removed from the main surface 2. FIG. 7 illustrates the diamond crystal 1 with the affected region removed by the CMP.

In the CMP, a polishing agent is used, which may be a commercially available product, exampling including zinc oxide, chromium oxide, cerium oxide, titanium oxide, ferric oxide, and silica. Also, a polishing pad is used in the CMP and may be a commercially available product.

The principle behind how the affected region 1*a* was removed by the CMP is known. The Applicant, however, established a theory that explains that the affected region 1*a* is removed quickly before new affected regions are formed by the CMP, making the affected regions on the main surface 2, including the affected region, 1*a*, removable completely by the CMP. As described above, a theory has been established explaining that the (111) direction of the diamond crystal 1 and a direction parallel to the (111) direction are plane directions in which affected regions tend to appear comparatively easily when machining or processing is performed. Under this theory, it is considered that the affected region 1*a* is also subject to alteration under the CMP, which is possibly why the affected region 1*a* was removed quickly before new affected regions are formed by the CMP.

As has been described hereinbefore, the method according to this embodiment for polishing the diamond crystal 1 and the diamond crystal 1 according to this embodiment cause, purposefully by mechanical polishing, the affected region 1*a* to appear such that the affected region 1*a* is parallel to the direction of the plane orientation (111) of the diamond crystal 1 and penetrates the diamond crystal 1 onto the main surface 2. By causing the affected region 1*a* to temporarily appear collectively in a direction parallel to the direction of the plane orientation (111) of the diamond crystal 1, affected regions including the affected region 1*a* are removed completely by the CMP, which is performed after the mechanical polishing. In this manner, a method for polishing the diamond crystal 1 is realized such that the method eliminates the affected region 1*a* including dislocations from the main surface 2 of the diamond crystal 1. Also, such a diamond crystal 1 was realized that: the main surface 2 has a plane orientation of (100); no affected region 1*a* is contained in a direction parallel to the direction of the orientation (111); and the affected region 1*a* is removed from, and thus does not appear on, the main surface 2. It is to be noted that synchrotron x-ray topography, for example, may be used to check if the affected region 1*a* is present or absent.

Further, when the diamond crystal 1 prepared by the polishing method according to this embodiment is used in a semiconductor application, no affected regions 1*a* appear on the main surface 2. This eliminates or minimizes dislocations in the semiconductor layer formed on the main surface 2 and introduction of defects. This ensures that a diamond crystal 1 capable of improving semiconductor layer properties is provided.

It is to be noted that the surface roughness Rq of the main surface 2 is kept at equal to or less than 5 nm by performing CMP. Rq may be measured using a surface roughness measuring device. Thus, a diamond crystal whose main surface has a surface roughness Rq of equal to or less than 5 nm is obtained. This ensures that a diamond crystal usable as a growth foundation crystal for semiconductor layers is realized.

An example of the above-described embodiment will be described below. It is to be noted that the present invention will not be limited to the following example.

EXAMPLE

First, as a diamond crystal of this example, a diamond polycrystal was prepared by hetero-epitaxial growth. The diamond crystal had: a bulk body; a main surface having a plane orientation of (100); and <110> directions indicated by the arrows 5 in FIG. 1. The main surface had a quadrangular outer shape of 10 mm by 10 mm.

Next, using a polishing wheel, mechanical polishing was performed on the main surface of the diamond crystal that has been prepared. At the contact positions at which the polishing wheel contacts the entire area of the main surface of 10 mm by 10 mm, the tangent direction of a tangent on a curve extending in the rotation direction of the polishing wheel was set within a range of ±10° relative to the <110> direction of the diamond crystal.

Figure 8:
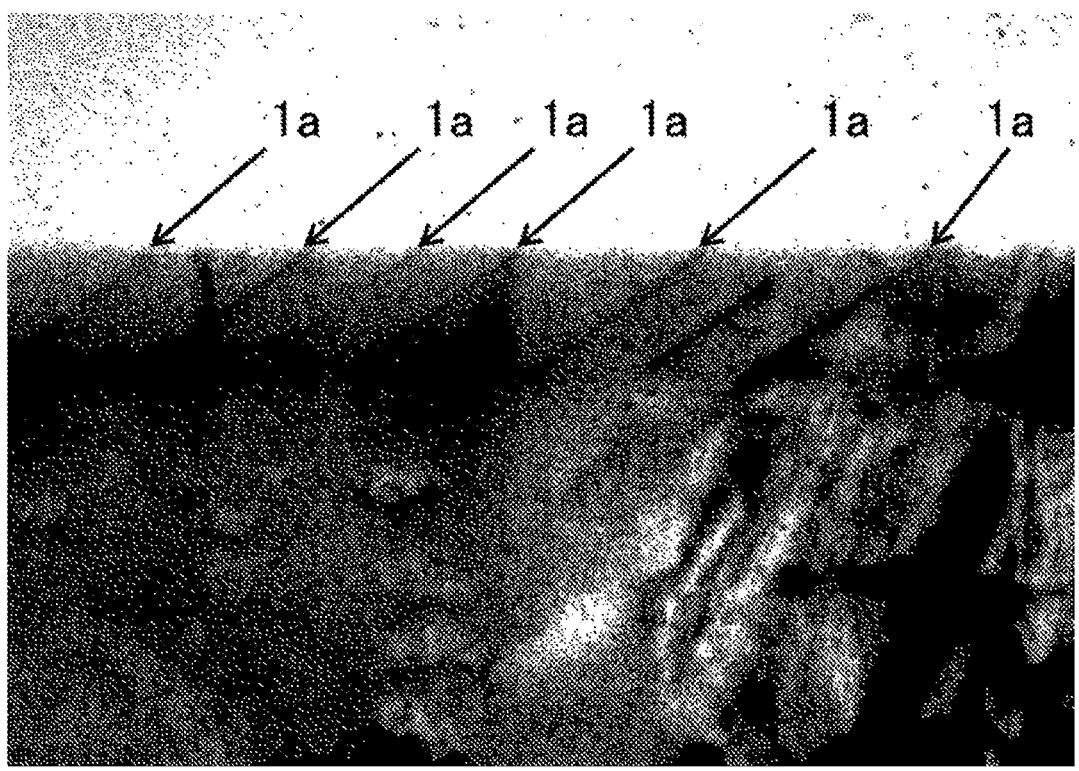
FIG. 8 is a topography picture of a side surface of a diamond crystal according to an embodiment of the present invention such that the picture is taken when the diamond crystal is observed by synchrotron x-ray topography after being subjected to mechanical polishing.

After the mechanical polishing, the diamond crystal was subjected to synchrotron x-ray topography. FIG. 8 shows a topography picture of a side surface of the diamond crystal obtained in the synchrotron x-ray topography. As shown in FIG. 8, a plurality of affected regions 1a were observed each extending from the main surface in a left diagonal direction and having an approximately uniform thickness. Specifically, the affected regions 1a appeared collectively in a direction parallel to the direction of the plane orientation (111) of the diamond crystal, and penetrated the diamond crystal onto the main surface.

Figure 9:
FIG. 9 is a topography picture of a side surface of the diamond crystal according to the embodiment of the present invention such that the picture is taken when the diamond crystal is observed by synchrotron x-ray topography after being subjected to CMP.

Next, CMP was performed on the main surface of the diamond crystal 50 hours. In the CMP, a commercially available polishing agent and a commercially available polishing pad were used. After the CMP, the diamond crystal was subjected to synchrotron x-ray topography. FIG. 9 shows a topography picture of a side surface of the diamond crystal obtained in the synchrotron x-ray topography. As shown in FIG. 9, it was observed that the plurality of affected regions 1a had been removed from the main surface and areas near the main surface.

It was also observed that the surface roughness Rq of the main surface subjected to the CMP was kept at equal to or less than 5 nm.

Obviously, numerous modifications and variations of the present invention are possible in light of the above teachings. It is therefore to be understood that within the scope of the appended claims, the present invention may be practiced otherwise than as specifically described herein.

What is claimed is:

1. A method for polishing a diamond crystal, the method comprising:
   providing a diamond crystal having a main surface having a plane orientation of (100);
   performing mechanical polishing on the main surface of the diamond crystal using a polishing wheel such that:
      a tangent of a contact position on the diamond crystal contacts a curve that extends in a rotation direction in which the polishing wheel is rotating and that contacts the contact position at which the diamond crystal contacts the polishing wheel that is rotating; and a tangent direction of the tangent at the contact position is within a range of ±10 degrees relative to a <110> direction of the diamond crystal, thereby causing an affected region to appear such that the affected region is parallel to a direction of a plane orientation (111) of the diamond crystal and penetrates the diamond crystal onto the main surface; and
   performing chemical mechanical polishing on the main surface of the diamond crystal to remove the affected region, thereby removing the affected region from the main surface.

2. The method for polishing a diamond crystal according to claim 1, wherein the step of performing chemical mechanical polishing comprises making a surface roughness Rq of the main surface equal to or less than 5 nm.

* * * * *